United States Patent [19]
Herchner

[11] 3,769,603
[45] Oct. 30, 1973

[54] GYRATOR AMPLIFIER

[75] Inventor: Dieter Herchner, Heilbronn, Germany

[73] Assignee: Licentia, Patent-Verwaltungs-GmbH, Frankfurt am Main, Germany

[22] Filed: Mar. 20, 1972

[21] Appl. No.: 236,322

[52] U.S. Cl. ........................ 330/13, 330/15, 330/17, 333/80 T
[51] Int. Cl. ................................................ H03f 3/18
[58] Field of Search .......................... 330/13, 15, 17; 333/80 R, 80 T

[56] References Cited
UNITED STATES PATENTS

| | | | |
|---|---|---|---|
| 3,400,335 | 9/1968 | Orchard et al. | 333/80 X |
| 3,413,576 | 11/1968 | Sheahan | 333/80 |
| 3,448,411 | 6/1969 | Patterson | 333/80 |

*Primary Examiner*—Roy Lake
*Assistant Examiner*—Lawrence J. Dahl
*Attorney*—George H. Spencer et al.

[57] ABSTRACT

A gyrator amplifier comprising first and second amplifier stages connected in push pull, the first stage being non-inverting and terminated by a capacitance and the second stage being inverting. Each stage includes transistors and resistances. The amplitudes of the a.c. voltage at the capacitance and at the input of the first stage and at the output of the second stage are equal. The steepness of the first stage is $S_I = \omega C$ and the steepness of the second stage is $S_{II} = 1/\omega L$, with C being the value of the terminal capacitance and L being the value of the inductance to be realised. The resistors are such that the gyrator is modulated uniformly at all potential points utilising the whole available D.C. voltage.

4 Claims, 5 Drawing Figures

GYRATOR AMPLIFIER

BACKGROUND OF THE INVENTION

The invention relates to a gyrator amplifier with two amplifier stages connected in push-pull, of which the first stage is non-inverting and terminated by a capacitance, while the second stage is an inverting stage, and both stages consist, of transistors and resistors.

In microelectronics, it has hitherto been impossible to integrate inductances directly. It is therefore necessary to replace conventional circuits equipped with coils by circuits which contain only active elements, resistors and capacitors. A possibility of realising inductances directly is provided by the gyrator. It transforms a capacitance at the output terminals of the gyrator into an inductance at the input terminals.

The gyrator belongs, as also does the transformer, in the group of converter quadripoles, but is, contrary to the transformer, a non-reciprocal quadripole with respect to the Y-matrix $$\|Y\| = \begin{Vmatrix} 0 & \pm Y_{12} \\ -Y & \\ +21 & 0 \end{Vmatrix}$$

If this quadripole is terminated by a conductance $Y_2$, the input conductance may be calculated as $Y_I = -(Y_{12} \cdot Y_{21}/Y_2)$ The gyrator is realised by means of amplifier circuits. Contrary to a coil, such an amplifier circuit will accept a d.c. input. For this reason, gyrator circuits are preferably dimensioned for minimum d.c. power input.

SUMMARY OF THE INVENTION

It is an object of the invention to provide a gyrator amplifier with optimum dimensions.

According to the invention, there is provided a gyrator amplifier comprising a first non-inverting amplifier stage including transistors and resistors, a capacitance terminating the first amplifier stage, the first amplifier stage having a steepness $S_I = \omega$ C, where C is the value of the terminating capacitance, and a second inverting amplifier stage connected in push-pull with the first amplifier stage and including transistors and resistances, the second amplifier stage having a steepness $S_{II} = 1/\omega$ L, where L is the value of an inductance to be realised by the gyrator amplifier, the amplitudes of the a.c. voltage at said terminating capacitance and at the input of the first stage and at the output of the second amplifier stage being of equal magnitude and said resistances being dimensioned such that the gyrator amplifier is modulated uniformly at all potential points utilising the whole available d.c. voltage.

BRIEF DESCRIPTION OF THE DRAWINGS

The invention will now be described in greater detail, by way of example, with reference to the drawings, in which.

DESCRIPTION OF THE PREFERRED EMBODIMENT

In a gyrator amplifier consisting of two amplifier stages connected in push pull, in which the first stage is non-inverting and terminated by a capacitance while the second stage is inverting and wherein each stage consists of transistors and resistors, it is proposed that the circuit is dimensioned in such a way that the amplitudes of the a.c. voltage at the capacitance and at the input of the first, and the output of the second stage, respectively, are of equal magnitude, wherein the amount of steepness of the first stage is chosen $S_I = \omega$ C, while the amount of steepness of the second stage is chosen as $S_{II} = 1/\omega$ L wherein C is the value of the terminal capacitance and L is the value of the inductance to be realised, and wherein the resistances of the circuit are dimensioned in such a way that the gyrator is modulated uniformly at all potential points, utilising the entire available d.c. voltage A.

The invention is therefore based on the principle that the resistances are dimensioned in such a manner that the available d.c. voltages are fully modulated at all potential points by the positive and by the negative half-waves of the available a.c. voltages. In this case, no d.c. components will remain unutilized in the circuit and the circuit has optimum dimensions throughout.

As already mentioned, the gyrator consists of two amplifier stages which contain transistors. The steepnesses of these amplifier should be independent of the steepness of the transistors. This is achieved by the corresponding negative feedback of the circuits. In the following dimensional data it will be assumed that the frequency, at which the maximum a.c. voltage occurs at the inductance, and the value of the inductance L are known. The value of the inductance results generally from the inductance required of a certain circuit, which is to be realised by the gyrator.

Figure 1:
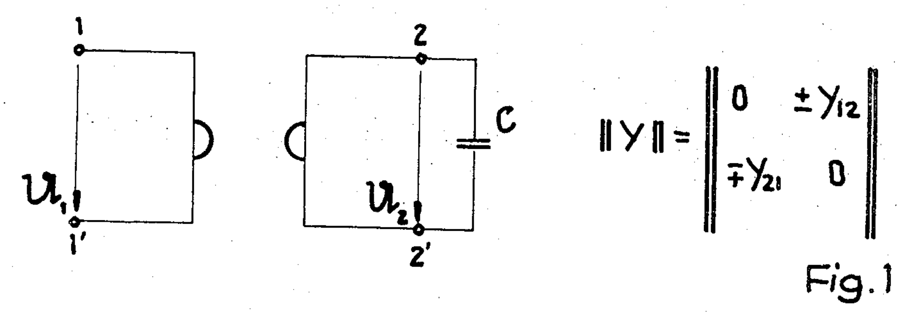
FIG. 1 shows symbolically a gyrator with a terminal capacitance.
Figure 2:
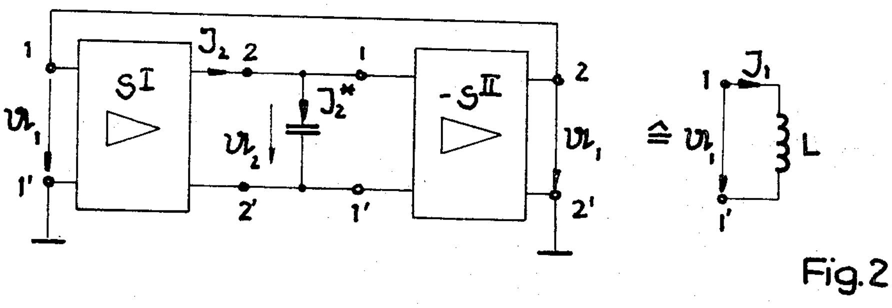
FIG. 2 shows diagrammatically the realisation of an inductance by tow amplifier stages.

FIG. 1 shows the gyrator symbol with the terminal capacitance C. FIG. 2 shows the realisation of the inductance by two amplifier stages I and II, having steepnesses with different signs, i.e., the steepness of amplifier II is negative relative to the steepness of amplifiter I. Hence, the steepness values mentioned above are amounts, or quantities. FIG. 2 also shows that the two amplifier stages correspond to an inductance at the terminals 1 1'. The output of the amplifier II is coupled back to the input 1 of the amplifier I.

Figure 3:
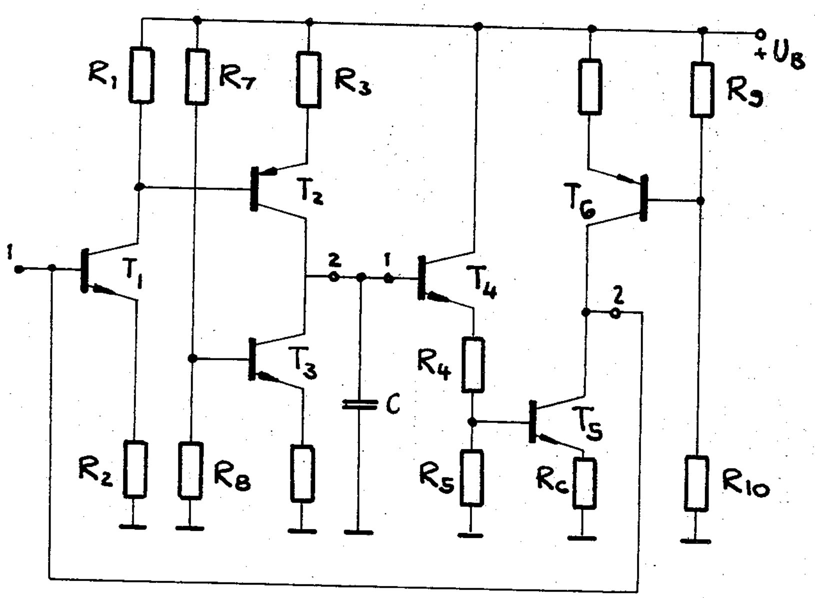
FIG. 3 shows a basic circuit diagram of a gyrator.

The dimensioning according to the invention is releaised by a basic circuit diagram of a gyrator, such as is shown in FIG. 3. Accordingly, the gyrator consists of two amplifiers. The first amplifier is formed from two transistors $T_1$ and $T_2$ which are complementary. The first transistor $T_1$ has in the emitter lead a resistor $R_2$ and in the collector lead a resistor $R_1$. The collector of this transistor is also connected with the base electrode of the second transistor $T_2$ which has the emitter lead resistor $R_3$. The collector resistance of this transistor is formed by the collector-emitter path of an additional transistor $T_3$, in order to produce a high output resistance of this stage. The base of this transistor $T_3$ is connected with a voltage divider comprising resistors $R_7$ and $R_8$. The resistor $R_1$, $R_7$ and $R_3$ are connected to one terminal of the d.c. supply voltage, in this case to $+U_B$, while the resistors $R_2$ and $R_8$ are connected to the other terminal, in this case to ground $T_1$ is, for example, an *n-p-n* transistor and $T_2$ a *p-n-p* transistor. Thus, the active parts of this amplifier stage consist of transistors $T_1$ and $T_2$ and resistors $R_1$, $R_2$ and $R_3$. $T_3$ acts as load resistance.

The second amplifier stage also consists of two transistors $T_4$ and $T_5$. Here again, a transistor $T_6$ serves to produce a high output resistance. The two transistors $T_4$ and $T_5$ may be, for example, *n-p-n* transistors and are operated in common emitter circuit. the emitter lead of the transistor $T_4$ contains a voltage divider with resistors $R_4$ and $R_5$. The center tap of this voltage divider is connected with the base electrode of the transistor $T_5$, the emitter lead of which contains a resistor $R_6$. The collector of the transistor $T_5$ is connected with the collector-emitter path of a transistor $T_6$, the base electrode of which is connected to a base voltage divider comprising resistors $R_9$ and $R_{10}$. Capacitor C is connected in parallel respectively, to the output of the stage I and to the input of the stage II. The output 2 of the second amplifier is connected back to the input 1 of the first amplifier.

The two amplifier stages have the steepness $S_I = Y_{12}$ and $S_{II} = Y_{21}$. The two input admittances $Y_{11}$ and $Y_{21}$ move towards zero. If an a.c. voltage $$U_1 = I_1 j\,\omega L,$$

is applied to the input terminals 1, 1', the output terminals 2, 2' will carry the voltage $$U_2 = I_2^* \cdot 1/j\omega C$$

for the amplifier stage I.

Assuming that, at the frequency under review, the input conductance of the amplifier stage II is substantially smaller than the admittance of the terminal capacitance $C$, one obtains, with the output current of the amplifier stage I.

$$I_2 = I_2^* = U_1 \cdot S_I$$

the a.c. voltage of the capacitance C at $$U_2 = U_1 \cdot S_I \cdot 1/j\omega C$$

As already mentioned, for a uniform modulation of the amplifiers it is necessary that the amplitudes of the a.c. voltage $U_1$ and $U_2$ should have the same value. In view of this condition of equal amplitude values at the terminals 1, 1' and 2, 2', the steepness of the amplifier stage I may be calculated at $$S_I = \omega\, C.$$

Then, the steepness of the second amplifier stage II is quantitatively $S_{II} = 1/\omega L$ It follows therefrom that the steepness of the first amplifier is governed by the selected terminal capacitance $C$, while the steepness of the second amplifier stage must be selected in accordance with the inductance $L$ to be simulated.

In gyrator circuits with minimum d.c. input, the direct currents in the amplifier stages must be kept as small as possible. In the following calculations, reference is made to FIGS. 4 and 5. These Figures show the dynamic elements of the amplifier stages in conjunction with the magnitudes necessary for the calculation.

Figure 4:
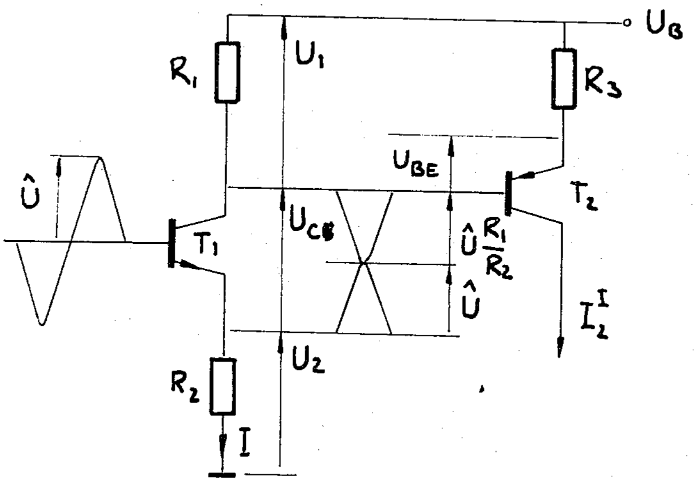
FIG. 4 shows the dynamic elements of the first amplifier stage of a gyrator for calculation purposes.
Figure 5:
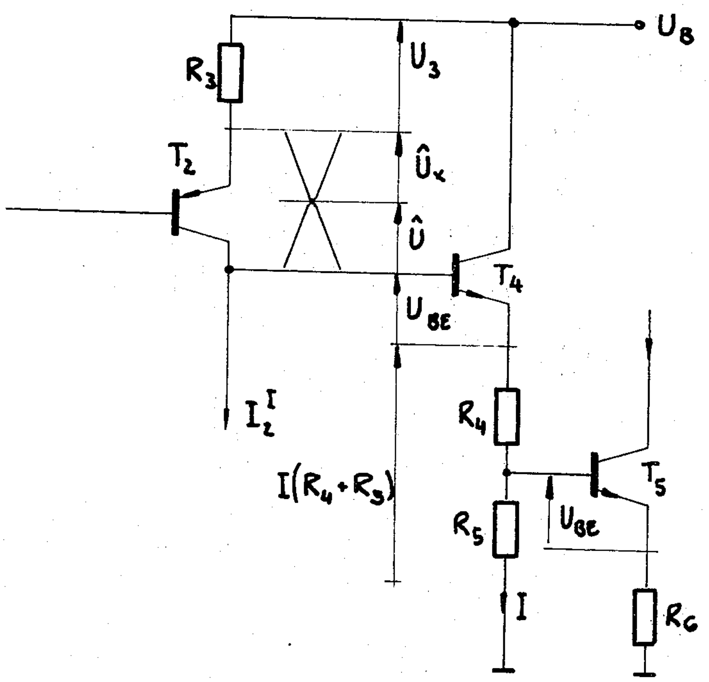
FIG. 5 shows the dynamic elements of the second amplifier stage for calculation purposes.

The required minimum battery voltage is determined by the amplifier stage I, shown in FIG. 4 and not rotating the phase. The minimum permissible d.c. is $I_{21} = \hat{i}_2 = \hat{U}S_I$. With the other valid equations.

$$U_B - U_1 - U_{CE} - U_2 = 0$$
$$R_1 = (I_{2I}R_3 + U_{BE})/I$$
$$R_2 = R_1/R_3 \cdot S_I$$

one obtains with optimisation the resistance $R_{3opt}$ at $$R_{3opt} = (1/S_I) \cdot \sqrt{U_{BE}/U}$$

With this optimum resistance value, the resistances $R_1$ and $R_2$ are $$R_1 = (U_{BE} + \sqrt{\hat{U} \cdot U_{BE}})/I$$

$R_2 = (U + \sqrt{\hat{U} \cdot U_{BE}/I}$ Only in the special case where the value of the input a.c. voltage corresponds to the base-emitter d.c. voltage, will the resistors $R_1$ and $R_2$ have the same value. The transistor $T_1$ then has the voltage gain $V_u = 1$.

The necessary minimum battery voltage is then calculated at $$U_{Bmin} = 2\,\hat{U} + U_{BE} + 3\sqrt{\hat{U} \cdot \cdot U_{BE}}$$

Here, the residual voltages of the transistors have been disregarded. The resistors of the amplifier stage II which are decisive for the dynamic behaviour, may be calculated with the level values of FIG. 5 and the following relations:

$$U_B - U_3 - \hat{U}_4 - \hat{U} - U_{BE} - I(R_4 + R_5) = 0$$
$$\hat{U}_X = I_{2I} \cdot R_3 = \hat{U} \cdot S_I \cdot R_3$$
$$U_3 = I_{2I} \cdot R_3 = \hat{U} \cdot S_I \cdot R_3$$

It follows therefrom:

$R_4 = (\hat{U} - U_{BE}/I) = R_2 - R_1$ with $\hat{U} > U_{BE}$
$R_4 = 0$ with $\hat{U} \leqq U_{BE}$
$R_5 = (U_{BE} + \sqrt{U \cdot U_{BE}/I})$ with $\hat{U} > U_{BE}$
$R_5 = \hat{U} + U_{BE}/I$ with $U \leqq U_{BE}$ with $T_4$
$R_6 = 1/S_{II} \cdot \sqrt{U_{BE}/\hat{U}}$ with $\hat{U} > U_{BE}$
$R_6 = 1/S_{II}$ with $\hat{U} \leqq U_{BE}$ The transistor $T_4$ may be omitted, if $\hat{U} = U_{BE}$ and therefor $R_4 = 0$. For the case $\hat{U} < U_{BE}$, transistor $T_4$ must remain in the circuit, while $R_4 = 0$.

Here I is the emitter current through the transistor $T_4$ which also corresponds to the emitter current through transistor $T_1$. $R_4$ then becomes 0, if $\hat{U} = U_{BE}$. Then, $U_{Bmin} = 6U_{BE}$. If the value for the base-emitter voltage of the transitors is assumed to be 0.6 V, $R_4 = 0$ when the battery voltage is 3.6 V.

With resistors having the values indicated, a gyrator amplifier with optimum dimensions is obtained, which requires a minimum power input. For the calculation of the individual resistance values, the valye of the inductance L, the maximum a.c. voltage $\hat{U}$ occurring at the inductance, and the associated circuit frequency $\omega$ must be known. The emitter currents of the transistors $T_1$ and $T_4$, are chosen to be of equal magnitude.

It will be understood that the above description of the present invention is suceptible to various modification changes and adaptations.

What is claimed is:

1. A gyrator amplifier comprising in combination: a first non-inverting amplifier stage including a first transistor, a second transistor complementary to said first transistor, an emitter lead for said first transistor, a first resistance in said emitter lead for said first transistor, a collector lead for said first transistor, a second resistance in said collector lead for said first transistor, an emitter lead for said second transistor, a third resistance in said emitter lead for said second transistor, a base electrode for said second transistor, a collector electrode for said first transistor, means for connecting said base electrode of said second transistor to said collector electrode of said first transistor, a first supply voltage, terminal means for connecting said second and third transistors to said first supply voltage terminal, a second supply voltage terminal and means for connecting said first resistance to said second supply voltage terminal; said first resistance having the value $$R_1 = (U_{BE} + \sqrt{\hat{U} \cdot U_{BE}})/I$$

said second resistance having the value $$R_2 = (\hat{U} + \sqrt{\hat{U} \cdot U_{BE}})/I$$

and said third resistance having a value $$R_{3opt} = (1/S_I \sqrt{UBE/\hat{U}})$$

where I is the emitter current of said first transistor, $\hat{U}$ is the peak a.c. voltage at the gyrator terminals and $U_{BE}$ is the base to emitter voltage of said first and second transistors; a capacitance terminating said first amplifier stage; said first amplifier stage having a steepness $S_I = \omega C$, where C is the value of said terminating capacitance, and a second inverting amplifier stage connected in push-pull with said first amplifier stage having a steepness $S_{II} = 1/\omega L$, where L is the value of an inductance to be realized by said gyrator amplifier, and including third and fourth transistors, a base electrode for said third transistor connected to said collector electrode of said second transistor and to said terminating capacitance, an emitter lead for said third transistor, a voltage divider including fourth and fifth resistances in said emitter lead of said third transistor, a base electrode for said fourth transistor, means for connecting said base electrode of said fourth transistor to said voltage divider between said fourth and fifth resistances, an emitter lead for said fourth transistor and a sixth resistance on said emitter lead of said fourth transistor, said fourth resistance having a value $$R_4 = \hat{U} - U_{BE}/I = R_1 - R_2$$

said fifth resistance having a value $$R_5 = U_{BE} + \sqrt{\hat{U} \cdot U_{BE}}/I = R_1$$

and said sixth resistance having a value $$R_6 = 1/S_{II} \sqrt{U_{BE}/\hat{U}}$$

where $\hat{U}$ is larger than $U_{BE}$; the amplitudes of the a.c. voltage at said terminating capacitance and at the input of said first stage and at the output of said second amplifier stage being of equal magnitude and said resistances being so dimensioned that the gyrator amplifier is modulated uniformly at all potential points, utilizing the whole available d.c. voltage.

2. A gyrator amplifier as defined in claim 1, wherein said d.c. supply voltage has a value $$U_{Bmin} = 2\hat{U} + U_{BE} + 3 \sqrt{\hat{U} \cdot U_{BE}}$$

3. A gyrator amplifier comprising in combination: a first non-inverting amplifier stage including a first transistor, a second transistor complementary to said first transistor, an emitter lead for said first transistor, a first resistance in said emitter lead for said first transistor, a collector lead for said first transistor, a second resistance in said collector lead for said first transistor, an emitter lead for said second transistor, a third resistance in said emitter lead for said second transistor, a base electrode for said second transistor, a collector electrode for said first transistor, means for connecting said base electrode of said second transistor to said collector electrode of said first transistor, a first supply voltage, terminal means for connecting said second and third transistor to said first supply voltage terminal, a second supply voltage terminal and means for connecting said first resistance to said second supply voltage terminal; said first resistance having the value $$R_1 = (U_{BE} + \sqrt{\hat{U} \cdot U_{BE}})/I$$

and said second resistance having the value $$R_2 = (\hat{U} + \sqrt{\hat{U} \cdot U_{BE}})/I$$

and said third resistance having a value $$R_{3opt} = 1/S_I \sqrt{UBE/\hat{U}}$$

where *I* is the emitter current of said first transistor, *U* is the peak a.c. voltage at the gyrator terminals and $U_{BE}$ is the base to emitter voltage of said first and second transistors; a capacitance terminating said first amplifier stage, said first amplifier stage having a steepness $S_I = \omega C$, where *C* is the value of said terminating capacitance, and a second inverting amplifier stage connected in push-pull with said first amplifier stage having a steepness $S_{II} = 1/\omega L$, where *L* is the value of an inductance to be realized by said gyrator amplifier, and including third and fourth transistors, a base electrode for said third transistor connected to said collector electrode of said second transistor and to said terminating capacitance, an emitter lead for said third transistor, a fifth resistance in said emitter lead of said third transistor, a base electrode for said fourth transistor, means for connecting said base electrode of said fourth transistor to said fifth resistance, an emitter lead for said fourth transistor and a sixth resistance in said emitter-lead of said fourth transistor, said fifth resistance having the value $$R_5 = \hat{U} + U_{BE}/I$$

and said sixth resistance having the value $$R_6 = 1/S_{II}$$

where $\hat{U}$ is less than or equal to $U_{BE}$; the amplituudes of the a.c. voltage at said terminating capacitance and at the input of said first stage and at the output of said second amplifier stage being of equal magnitude and said resistance being so dimensioned that the gyrator amplifier is modulated uniformly at all potential points, utilizing the while available d.c. voltage.

4. A gyrator amplifier as defined in claim 3 wherein said d.c. supply voltage has a value $$U_{Bmin} = 2\hat{U} + 2U_{BE} + 2 \sqrt{\hat{U} \cdot U_{BE}}$$

* * * * *